US006266755B1

(12) United States Patent
Yeager

(10) Patent No.: US 6,266,755 B1
(45) Date of Patent: *Jul. 24, 2001

(54) TRANSLATION LOOKASIDE BUFFER WITH VIRTUAL ADDRESS CONFLICT PREVENTION

(75) Inventor: Kenneth C. Yeager, Sunnyvale, CA (US)

(73) Assignee: MIPS Technologies, Inc., Mountain View, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/772,233

(22) Filed: Dec. 23, 1996

Related U.S. Application Data

(63) Continuation of application No. 08/324,128, filed on Oct. 14, 1994, now abandoned.

(51) Int. Cl.[7] ........................................... G06F 9/34
(52) U.S. Cl. .................... 711/210; 711/202; 711/203; 711/206; 711/207
(58) Field of Search .................... 711/202, 203, 711/206, 207, 210

(56) References Cited

U.S. PATENT DOCUMENTS

| | | | |
|---|---|---|---|
| 4,473,878 | 9/1984 | Zolnowsky et al. | 711/208 |
| 4,812,969 * | 3/1989 | Takagi et al. | 711/209 |
| 4,953,073 | 8/1990 | Moussouris et al. | 711/3 |
| 5,226,133 | 7/1993 | Taylor et al. | 711/207 |
| 5,237,671 * | 8/1993 | Freitas et al. | 711/207 |
| 5,263,140 * | 11/1993 | Riordan | 711/207 |
| 5,325,507 | 6/1994 | Freitas et al. . | |
| 5,396,448 * | 3/1995 | Takayanagi et al. | 365/49 |
| 5,420,992 * | 5/1995 | Killian et al. | 395/500 |
| 5,526,504 | 6/1996 | Hsu et al. . | |
| 5,572,704 | 11/1996 | Bratt et al. . | |
| 5,574,877 | 11/1996 | Dixit et al. . | |
| 5,604,909 | 2/1997 | Joshi et al. . | |
| 5,619,672 | 4/1997 | Sutu et al. . | |
| 5,632,025 | 5/1997 | Bratt et al. . | |
| 5,740,402 | 4/1998 | Bratt et al. . | |
| 5,954,815 | 9/1999 | Joshi et al. . | |

FOREIGN PATENT DOCUMENTS 6-202954 * 8/1994 (JP) ................................ G06F/12/10

OTHER PUBLICATIONS

Cocke, et al., "The Evolution Of RISC Technology At IBM," IBM J. Res. Develop., vol. 34 No. 1, pp. 4–36 (Jan., 1990).
Kane et al., MIPS RISC Architecture, pp. ix to xiv, 4–8 to 4–30, Prentice–Hall, Inc. (1992).

* cited by examiner

Primary Examiner—Jack A. Lane

(57) ABSTRACT

A translation lookaside buffer for detecting and preventing conflicting virtual addresses from being stored therein is disclosed. Each entry in the buffer is associated with a switch which can be set and reset to enable and disable, respectively, a buffer entry. A switch associated with an existing entry will be reset if such entry conflicts with a new buffer entry.

23 Claims, 6 Drawing Sheets

TRANSLATION LOOKASIDE BUFFER WITH VIRTUAL ADDRESS CONFLICT PREVENTION

This is a Continuation of application Ser. No. 08/324,128, filed Oct. 14, 1994, now abandoned, the disclosure of which is incorporated by reference.

A preferred embodiment of the present invention is incorporated in a superscalar processor identified as "R10000," which was developed by Silicon Graphics, Inc., of Mountain View, Calif. Various aspects of the R10000 are described in the following commonly-owned patent properties having effective filing dates identical with that of the present application and incorporated herein by reference for all purposes: Ser. No. 08/813,500, which is a continuation of Ser. No. 08/324,124, now abandoned; Ser. No. 08/324,129, now abandoned; and U.S. Pat. No. 5,758,112, which issued from Ser. No. 08/796,142, which is a continuation of Ser. No. 08/324,127, now abandoned. Various aspects of the R10000 are also described in J. Heinrich, MIPS R1000 Microprocesser User's Manual, MIPS Technologies, Inc. (1994).

BACKGROUND OF THE INVENTION

This invention relates in general to computers and in particular, to the management of the computer's memory.

Virtually all computers today utilize what is known as virtual memory to provide more memory than physically available. A virtual address space is a set of memory addresses available for a program to use. Typically, the virtual address space is divided into blocks of equal size called pages. These blocks must be converted or mapped into the computer's physical memory. The mapping is performed using a translation buffer.

The translation buffer compares current virtual page address of a current instruction with previously translated instructions. If a match is found, that entry in the translation buffer is selected and its associated physical page address is provided. To improve throughput, the entries in the translation buffer are compared in parallel.

It is essential that the translation buffer does not contain multiple copies of identical virtual pages addresses. This can cause multiple entries to be selected, which may result in currents shorts that can cause damage to the computer.

To prevent conflicting entries, some systems implement an analog circuit that disables the translation buffer if several entries are simultaneously selected. However, the number of conflicting entries needed to trigger shutdown is imprecise, depending on circuit variations. Further, shutting down and resetting the translation buffer causes delay in the computer.

Thus, there is a need for providing a translation buffer that can detect multiple entries accurately as well as resolving discrepancies without hindering performance.

SUMMARY OF THE INVENTION

The present invention offers a highly efficient mechanism for implementing translations of virtual memory addresses into physical memory.

In one embodiment, the present invention provides translation buffer that can accurately prevent identical virtual page addresses from being stored in the translation buffer without having to shut down and reset the translation buffer.

A better understanding of the nature and advantages of the present invention may be had with reference to the detailed description and the drawings below.

DESCRIPTION OF THE PREFERRED EMBODIMENT

Contents

I. Superscalar Processor Architecture
A. Superscalar Processor Overview
B. Operation
II. Memory Translation
A. Virtual Address Space
B. Virtual Address
C. Joint Translation Lookaside Buffer
  1. Overview
  2. Operation

I. SUPERSCALAR PROCESSOR ARCHITECTURE

Figure 1:
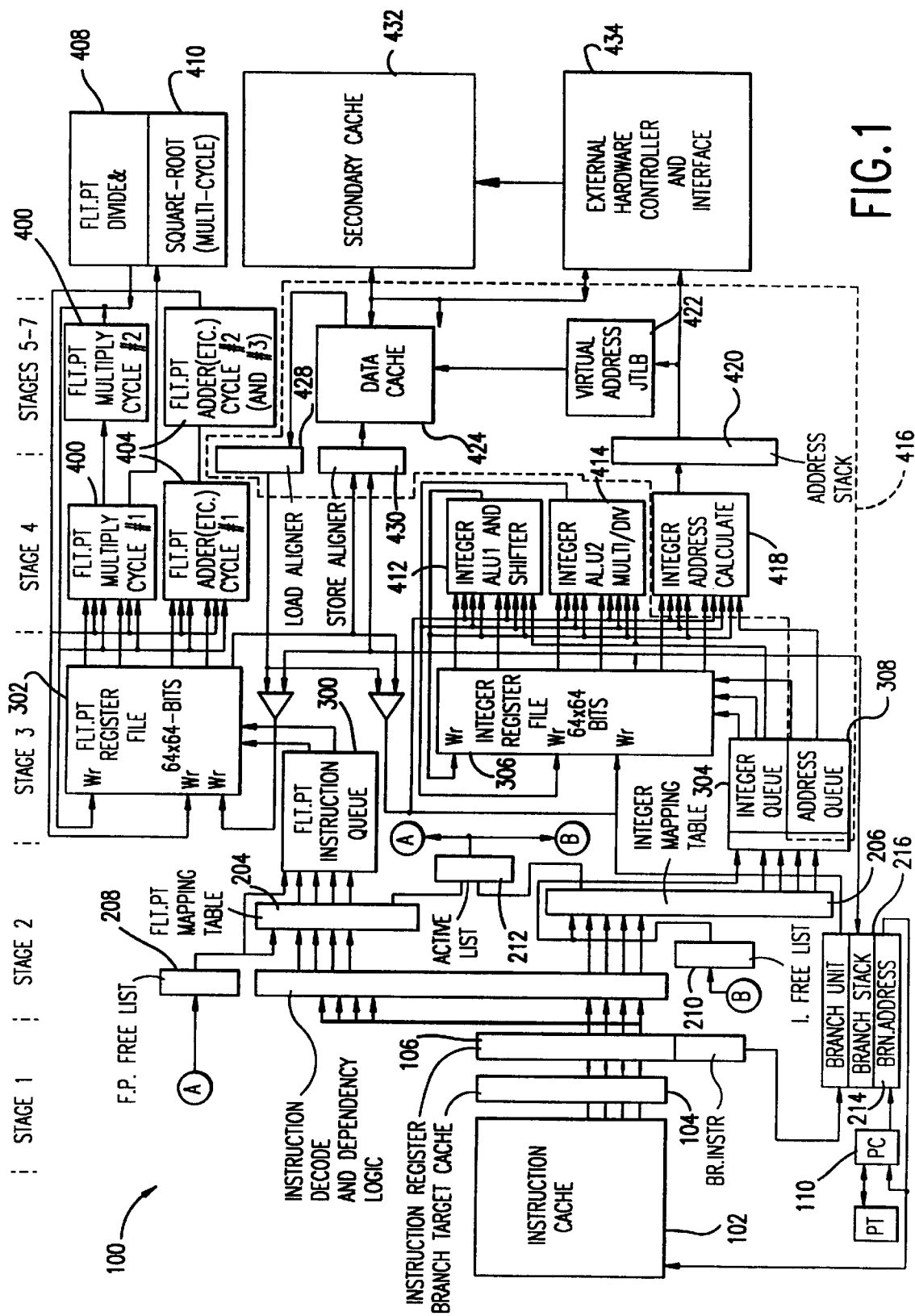
FIG. 1 discloses a functional block diagram of a superscalar processor.

FIG. 1 discloses a functional block diagram of a superscalar processor 100 which incorporates a redundant mapping mechanism built and operating in accordance with the present invention. As discussed below, this redundant mapping mechanism enables efficient recovery from branch mispredictions. Processor 100, which generally represents the R100000 Superscalar Processor developed by Silicon Graphics, Inc., of Mountain View, Calif., provides only one example of an application for the memory translation mechanism of the present invention.

A. Superscalar Processor Overview

A superscalar processor can fetch and execute more than one instruction in parallel. Processor 100 fetches and decodes four instructions per cycle. Each decoded instruction is appended to one of three instruction queues. These queues can issue one new instruction per cycle to each of five execution pipelines.

The block diagram of FIG. 1 is arranged to show the stages of an instruction pipeline and illustrates functional interconnectivity between various processor elements. Generally, instruction fetch and decode are carried out in stages 1 and 2; instructions are issued from various queues in stage 3; and instruction execution is performed in stages 4–7.

Referring to FIG. 1, a primary instruction cache 102 reads four consecutive instructions per cycle, beginning on any word boundary within a cache block. A branch target cache 104, instruction register 106, instruction decode, and dependency logic 200, convey portions of issued instructions to floating point mapping table 204 (32 word by 6 bit RAM) or integer mapping table 206 (33 word by 6 bit RAM). These tables carry out a "register renaming" operation, described in detail below, which renames logical registers identified in an instruction with a physical register location for holding values during instruction execution. A redundant mapping mechanism is built into these tables in accordance with the present invention to facilitate efficient recovery from branch mispredictions. Mapping tables 204 and 206 also receive input from a floating point free list 208 (32 word by 6 bit RAM) and an integer free list 210 (32 word by 6 bit RAM), respectively. Output of both mapping tables is fed to active list 212 which, in turn, feeds the inputs of free lists 208 and 210.

A branch unit 214 also receives information from instruction register 106, as shown in FIG. 1. This unit processes no more than one branch per cycle. The branch unit includes a branch stack 216 which contains one entry for each conditional branch. Processor 100 can execute a conditional branch speculatively by predicting the most likely path and decoding instructions along that path. The prediction is verified when the condition becomes known. If the correct path is taken, processing continues along that path. Otherwise, the decision must be reversed, all speculatively decoded instructions must be aborted, and the program counter and mapping hardware must be restored.

Referring again to FIG. 1, mapping tables 204 and 206 support three general pipelines, which incorporate five execution units. A floating-point pipeline is coupled to floating-point mapping table 204. The floating-point pipeline includes a sixteen-entry instruction queue 300 which communicates with a sixty-four-location floating point register file 302. Register file 302 and instruction queue 300 feed parallel multiply unit 400 and adder 404 (which performs, among other things, comparison operations to confirm floating-point branch predictions). Multiply unit 400 also provides input to a divide unit 408 and square root unit 410.

Second, an integer pipeline is coupled to integer mapping table 206. The integer pipeline includes a sixteen-entry integer instruction queue 304 which communicates with a sixty-four-location integer register file 306. Register file 306 and instruction queue 304 feed arithmetic logic units ("ALU") ALU#1 412 (which contains an ALU, shifter and integer branch comparator) and ALU#2 414 (which contains an ALU, integer multiplier and divider).

Third, a load/store pipeline (or load/store unit) 416 is coupled to integer mapping table 206. This pipeline includes a sixteen-entry address queue 308 which communicates with register file 306. The architecture of address queue 308 is described in detail in commonly-owned, co-pending patent application, Ser. No. 08/404,625, which is a continuation in part of Ser. No. 08/324,129, now abandoned.

Register file 306 and address queue 308 feed integer address calculate unit 418 which, in turn, provides virtual-address entries for address stack 420. These virtual addresses are converted to physical addresses in joint translation lookaside buffer (JTLB) 422 and used to access a data cache 424.

Data input to and output from data cache 424 pass through store aligner 430 and load aligner 428, respectively. Address stack 420 and data cache 424 also communicate with external hardware controller and interface 434. Further, data cache 424 and controller/interface 434 communicate with secondary cache 432.

B. Operation

Processor 100 uses multiple execution pipelines to overlap instruction execution in five functional units. As described above, these units include the two integer ALUs 412, 414, load/store unit 416, floating-point adder 404 and floating-point multiplier 400. Each associated pipeline includes stages for issuing instructions, reading register operands, executing instructions, and storing results. There are also three "iterative" units (i.e., ALU#2 414, floating-point divide unit 408, and floating-point square root unit 410) which compute more complex results.

Register files 302 and 306 must have multiple read and write ports to keep the functional units of processor 100 busy. Integer register file 306 has seven read and three write ports; floating-point register file 302 has five read and three write ports. The integer and floating-point pipelines each use two dedicated operand ports and one dedicated result port in the appropriate register file. Load/Store unit 416 uses two dedicated integer operand ports for address calculation. Load/Store unit also loads or stores either integer or floating-point values via a shared write port and a shared read port in both register files. These shared ports are also used to move data between the integer and floating-point register files.

In a pipeline, the execution of each instruction is divided into a sequence of simpler operations. Each operation is performed by a separate hardware section called a stage. Each stage passes its result to the next stage. Usually, each instruction requires only a single cycle in each stage, and each stage can begin a new instruction while previous instructions are being completed by later stages. Thus, a new instruction can often begin during every cycle.

Pipelines greatly improve the rate at which instructions can be executed. However, the efficient use of a pipeline requires that several instructions be executed in parallel. The result of each instruction is not available for several cycles after that instruction enters the pipeline. Thus, new instructions must not depend on the results of instructions which are still in the pipeline.

Processor 100 fetches and decodes instructions in their original program order but may execute and complete these instructions out of order. Once completed, instructions are "graduated" in their original program order. Instruction fetching is carried out by reading instructions from instruction cache 102, shown in FIG. 1. Instruction decode operation includes dependency checks and register renaming (discussed below), performed by instruction decode and dependency logic 200 and mapping tables 204 or 206, respectively. The execution units identified above compute an arithmetic result from the operands of an instruction. Execution is complete when a result has been computed and stored in a temporary register identified by register file 302 or 306. Finally, graduation commits this temporary result as a new permanent value.

An instruction can graduate only after it and all previous instructions have been successfully completed. Until an instruction has graduated, it can be aborted, and all previous register and memory values can be restored to a precise state following any exception. This state is restored by "unnaming" the temporary physical registers assigned to subsequent instructions. Registers are unnamed by writing an old destination register into the associated mapping table and returning a new destination register to the free list. Renaming is done in reverse program order, in the event a logical register was used more than once. After renaming, register files 302 and 306 contain only the permanent values which were created by instructions prior to the exception. Once an instruction has graduated, however, all previous values are lost.

Active list 212 is a list of "active" instructions in program order. It records status, such as which instructions have been completed or have detected exceptions. Instructions are appended to its bottom when they are decoded. Completed instructions are removed from its top when they graduate.

II. Memory Translation

A. Virtual Address Space

The virtual address space of microprocessor 100 may either be 32-bits or 64-bits in length as determined by the status register. The status register also controls the various microprocessor's operating modes. Table I lists the operating modes and their associated status register fields.

TABLE I

Processor Modes

| U4 31 | KX 7 | SX 6 | UX 5 | KSU 4:3 | ERL 2 | EXL 1 | IE 0 | Description | ISA −3 | ISA −4 | Addr |
|---|---|---|---|---|---|---|---|---|---|---|---|
| x |   |   | 0 | 10 | 0 | 0 |   | User Mode. | 0 | 0 | 32 |
| 0 |   |   | 1 | 10 | 0 | 0 |   | (Access to user memory) | 1 | 0 | 64 |
| 1 |   |   | 1 | 10 | 0 | 0 |   |   | 1 | 1 | 64 |
|   |   | 0 |   | 01 | 0 | 0 |   | Supervisor Mode. | 0 | 0 | 32 |
|   |   | 1 |   | 01 | 0 | 0 |   | (Access to supervisor or user memory) | 1 | 1 | 64 |
|   | 0 |   |   |   |   |   |   | Kernel Mode. |   |   |   |
|   | 1 |   |   |   |   |   |   | (Access to kernel, |   |   |   |
|   | 0 |   |   | 00 | 0 | 0 |   | supervisor, or user modes) | 0 | 0 | 32 |
|   | 1 |   |   | 00 | 0 | 0 |   |   | 1 | 1 | 64 |
|   | 0 |   |   | xx | 0 | 1 |   | --Exception Level. | 0 | 0 | 32 |
|   | 1 |   |   | xx | 0 | 1 |   |   | 1 | 1 | 64 |
|   |   |   |   | xx | 1 | x |   | --Error Level. | 0 | 0 | 32 |
|   |   |   |   | xx | 1 | x |   |   | 1 | 1 | 64 |
|   |   |   |   |   | 0 | 0 | 1 | interrupts are enabled |   |   |   |

The "KSU" field selects among kernel ("00"), supervisor ("01"), and user ("10") modes. These modes determine the privileges available to the computer program. The kernel mode is the most privileged; it can access and change any register. The inner core of the operating system runs in kernel mode. The supervisor mode has fewer privileges and is used for less critical sections of the operating system. The user mode is the least privileged; this protects users form interfering with one anther.

The "EXL" and "ERL" fields are used for handling exceptions and errors, respectively. When either of these fields are set (indicating an exception or error), the processor is forced into kernel mode, regardless of the "KSU" field.

The 1-bit "KX", "SX", and "UX" fields select the addressing mode for use in the different operating modes. "KX" is used in kernel mode; "SX" is used in supervisor mode and "UX" is used in user mode. A "0" in these fields selects 32-bit addressing mode; a "1" selects 64-bit addressing mode.

Figure 2:
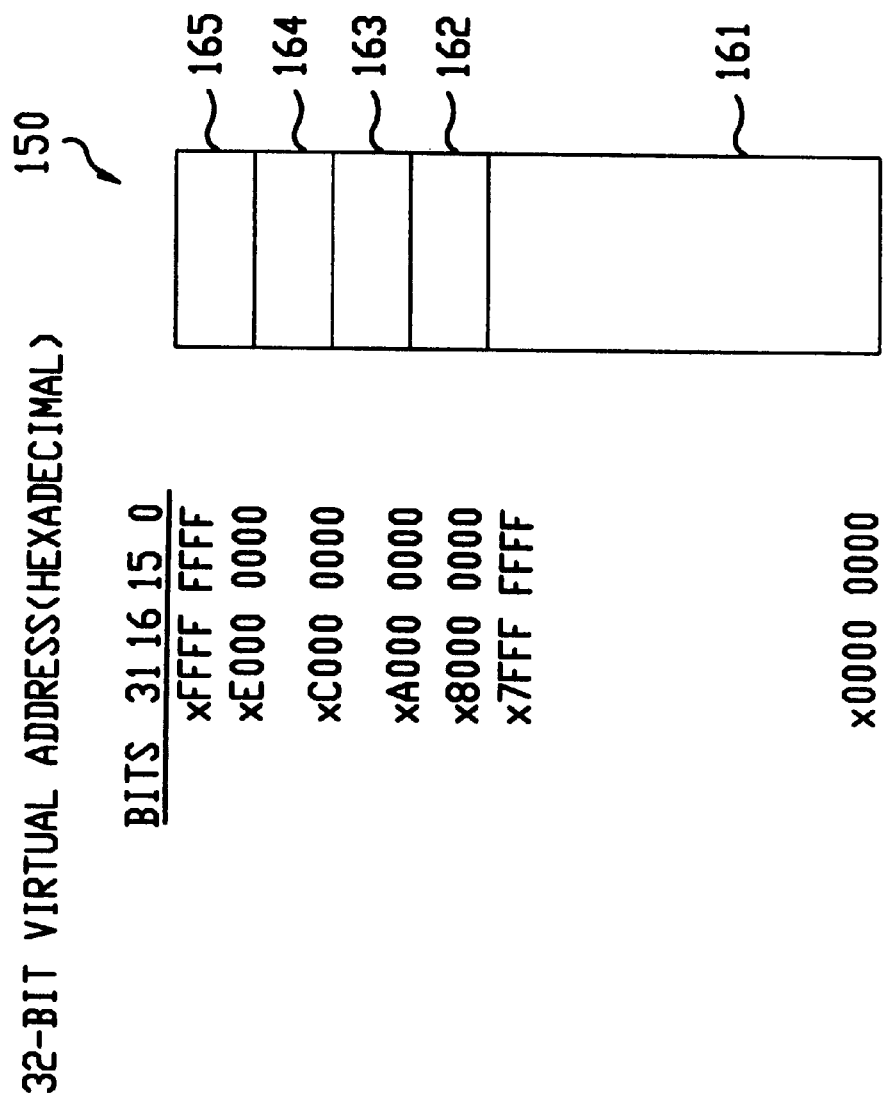
FIG. 2 discloses processor's addressing space in 32-bit mode.

Referring to FIG. 2, the 32-bit virtual memory address space 150 is divided into regions 161–165. Each region has specific characteristics and uses. The regions may have the following boundaries: X00000000 to X7FFFFFFF for region 161, X80000000 to X9FFFFFFF for region 162, XA0000000 to XBFFFFFFF region 163, XC0000000 to XDFFFFFFF for region 164, and XE0000000 to XFFFFFFFF region 165. The user can access only the region 161 which is referred to as the user region. The supervisor can access the user region or the supervisor region 164. An address error would occur if access to restricted regions is attempted. The kernel, which has the highest privilege, can access all regions; all 32-bit addresses are valid.

Regions 161, 162, and 164 are "mapped" regions. Conversely, regions 163 and 164 are "unmapped" regions. Virtual addresses for "umapped" regions are not translated using the JTLB. The JTLB's "cache map" field determines if the cache should be used.

Figure 3:
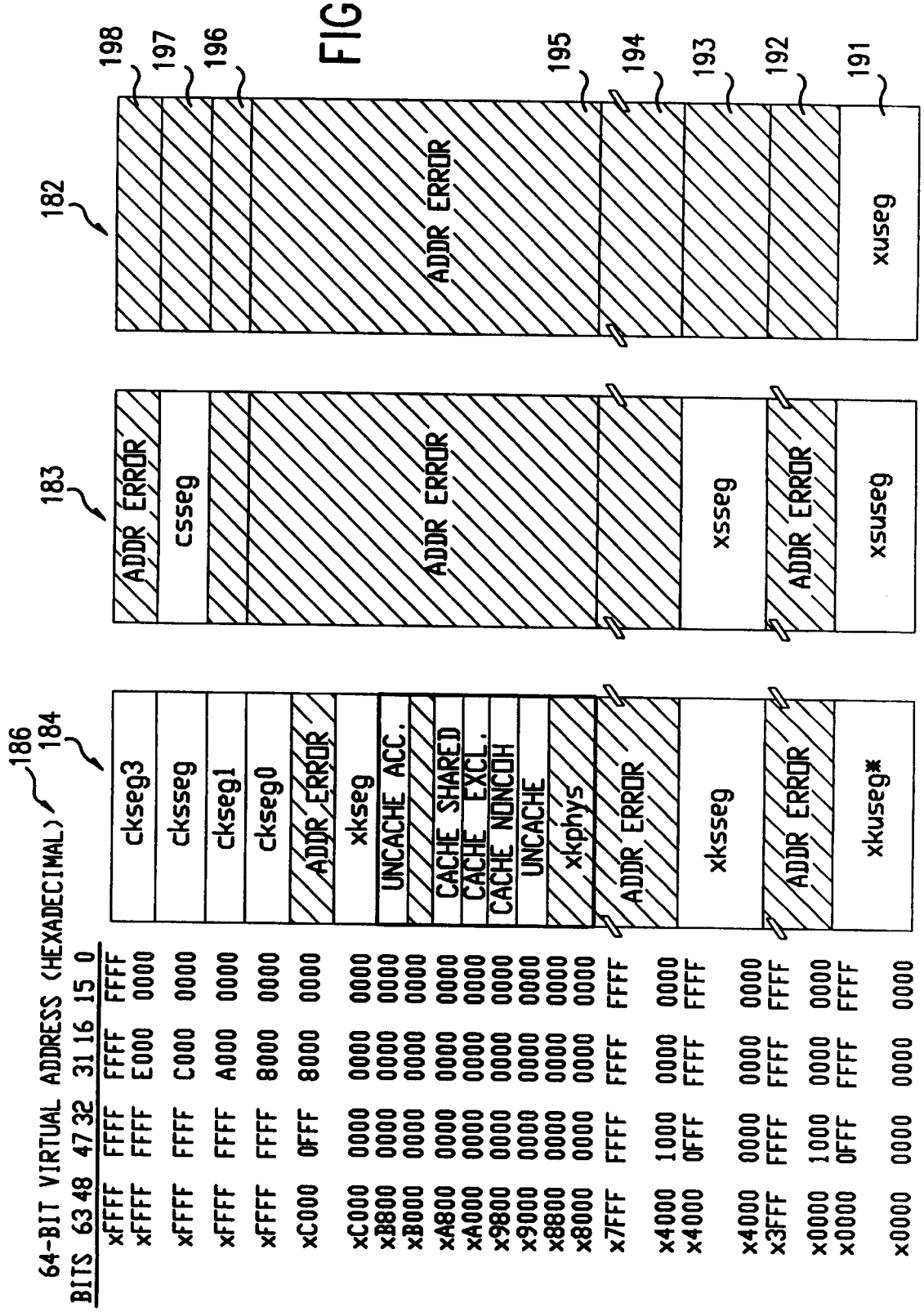
FIG. 3 discloses processor's addressing space in 64-bit mode.

FIG. 3 shows the 64-bit virtual address space 180, which is divided into eight regions 191–198. The address boundary of each region is shown by column 186. Column 182 represents the user accessible region 191 ("useg") of the address space; column 183 represents the regions in which the supervisor can use and column 184 are the regions used by the system kernel. As shown, not all 64-bit addresses are valid.

The "xkseg" region is almost a 40-bit region (1tera-byte). Its top 2 Gbyte is deleted, so that it does not overlap the four 0.5 Gbyte "ckseq . . . " regions in its low 40 bits. Otherwise, the JTLB associative circuits would need an extra bit (bit 40), to distinguish these regions.

The "xkphys" region consists of eight $2^{40}$-bit kernel physical address spaces. This region is selected when the two high virtual address bits (VAdr[63:621] equal "10". The physical address is taken from virtual address bits VAdr[39:0]. These addresses are unmapped, and the cache attributes are taken from bits VAdr[61:59]. Table II lists the cache attribute of the xkphys region. An address exception is detected if bits VAdr[58:40] are not zero.

TABLE II

Cache Attributes of "xkphys" Region
(Address space is selected by Virtual Address bits Vadr[61.59])

| Virtual Address (AAdr[63:0]) | Description |
|---|---|
| x8000 0000 0000 0000 thru x8000 00FF FFFF FFFF | (error) |
| x8800 0000 0000 0000 thru x8800 00FF FFFF FFFF | (error) |
| x9000 0000 0000 0000 thru x9000 00FF FFFF FFFF | Uncached. |
| x9800 0000 0000 0000 thru x9800 00FF FFFF FFFF | Non-coherent. |
| xA000 0000 0000 0000 thru xA000 00FF FFFF FFFF | Exclusive. |
| xA800 0000 0000 0000 thru xA800 00FF FFFF FFFF | Shared. |
| xB000 0000 0000 0000 thru xB000 00FF FFFF FFFF | (error) |
| xB800 0000 0000 0000 thru xB800 00FF FFFF FFFF | Accelerated. |

B. Virtual Address

As discussed, microprocessor 100 II can operate in either 32-bit or 64-bit addressing mode. However, address logic generates 64-bit values, even in 32-bit mode. In 32-bit addressing mode, the high 32 bits are equal to the sign bit (bit #31). Otherwise, an "address error" exception is taken. This error can occur if an address calculation overflows, or if a base or index register is not properly sign-extended. Table III lists the virtual address format for 32-bit addressing mode.

TABLE III

| 32-bit | add bits | bits value for 31:28 | Intermediate bits | regions bits 63:11 |
|---|---|---|---|---|
| kseg3 0.5 GB Mapped | 29:0 | 111 | | ones |
| ksseg 0.5 GB Mapped | 29:0 | 110 | | ones |
| kseg1 0.5 GB Unmapped Uncached | 29:0 | 101 | | ones |
| kseg0 0.5 GB Unmapped Cached | 29:0 | 100 | | ones |
| useg 2.0 GB User | 31:0 | 0 | | zero |

In 64-bit address mode, the virtual address space may be unnecessarily large and require more logic to translate into a physical address. To reduce the size of the JTLB, microprocessor 100 translates only 44-bit virtual addresses (VAdr [43:0]) with 2 region bits (VAdr[63:59]), which, if required, translates it into a 40-bit physical addresses (PAdr[39:01]). Table IV lists the virtual address format for 64-bit addressing mode.

TABLE IV

| 64-bit | add bits | bits value for 31:28 | Intermediate bits | regions bits 63:11 |
|---|---|---|---|---|
| ckseg3 Kernel Mapped | 28:0 | 111 | ones | 11 |
| cksseg Kernel Mapped | 28:0 | 110 | ones | 11 |
| ckseg1 Kernel Unmapped Uncached | 28:0 | 101 | ones | 11 |
| ckseg0 Kernel Unmapped Cached | 28:0 | 100 | ones | 11 |
| xkseg Kernel | 43:0 | | zero | 11 |
| xkphys Kernel Physical | 39:0 | | zero | 10ccc |
| xksseg Supervisor | 43:0 | | zero | 01 |
| xkuseg User | 43:0 | | zero | 00 |

The high two virtual address bits (bits 63:62) select among user ("00"), supervisor ("01"), and kernel ("11") address spaces. The intermediate address bits (61:44) are either all zero or all ones, depending on the address region. The JTLB does not include virtual address bits 61:59 because these are decoded only in the "xkphys" region, which is unmapped.

Programs may operate using either physical or virtual memory addresses. Physical addresses correspond to hardware locations in main memory. Virtual addresses are logical values only and they do not correspond to fixed hardware locations. Instead, virtual addresses are first translated into physical addresses before main memory is accessed. The ability to address memory logically is essential for multitasking computer systems. This affords the operating system flexibility to load programs anywhere in main memory independent of the logical addresses used by the programs. Virtual addressing provides memory protection to limit what memory each program may access, thus preventing programs from interfering with the memory used by other programs or the operating system.

In a multitasking operating system, the processor switches between running different program tasks. Each independent task has a separate address space, which is used to translate its virtual addresses. Each task is assigned a unique 8-bit "Address Space Identifier" ("ASID"). This identifier is stored with each JTLB entry to distinguish among entries loaded for different tasks, eliminating the need to invalidate JTLB entries during each context switch. Microprocessor's current ASID is stored in the low 8 bits of the "EntryHi" register. These bits are also used to load the ASID during a JTLB refill.

C. Joint Translation Lookaside Buffer

1. Overview

Figure 4A:
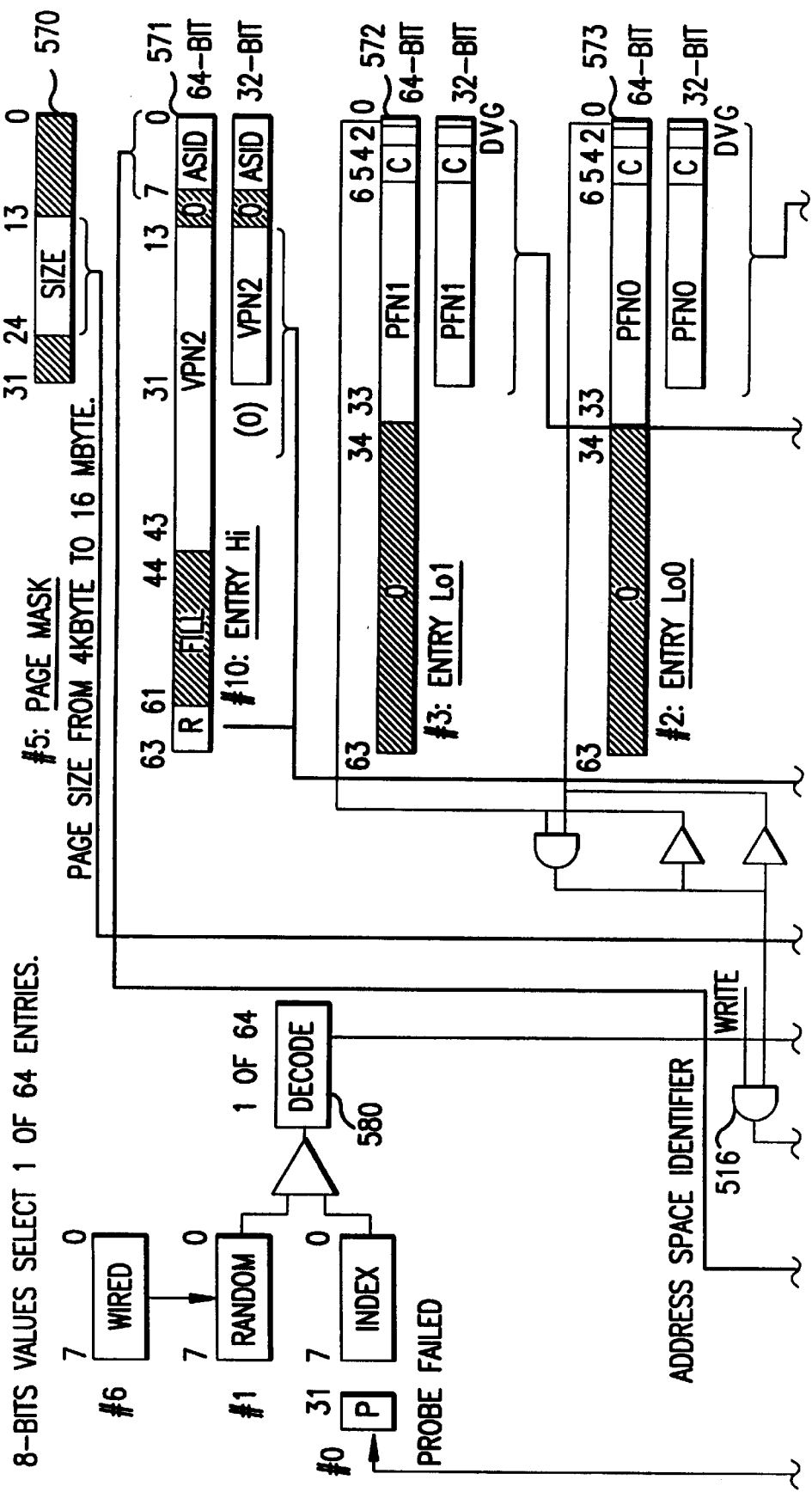
FIGS. 4A and 4B disclose a block diagram of a translation lookaside buffer.
Figure 4B:
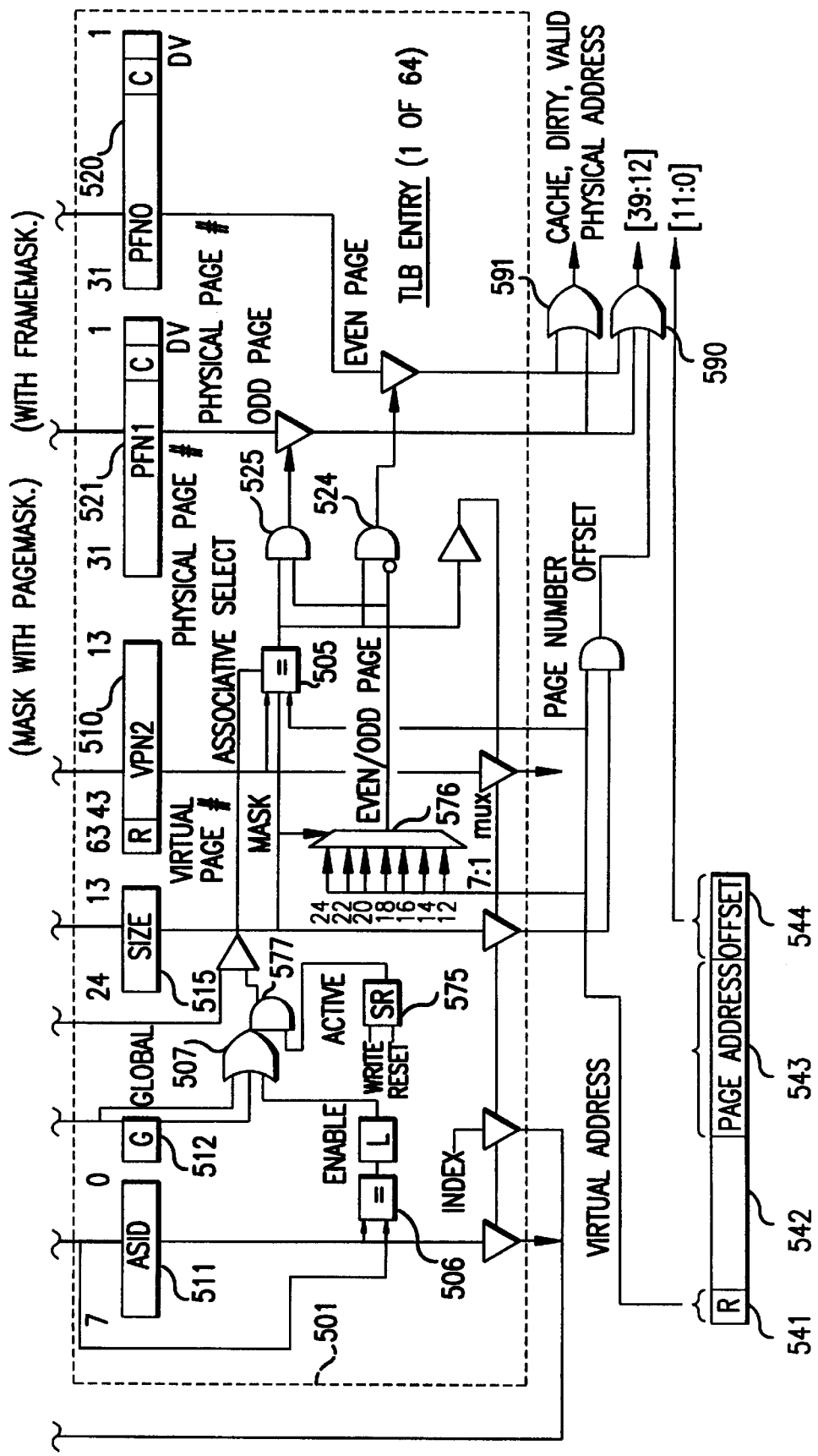

FIG. 4 shows a JTLB 500 that translates virtual address into a physical address. JTLB translates only address regions that are "mapped". For data cache accesses, the JTLB translates addresses from the address calculate unit. For instruction accesses, the JTLB translates the PC address if it misses in the ITLB. That entry is copied into the ITLB for subsequent accesses.

Virtual addresses are translated in blocks or pages which are mapped into blocks (page frames) in physical memory. Microprocessor 100 allows variable page sizing from 4K-bytes and 16M-bytes (in powers of 4). Virtual address bits 543, referred to as page address, are used to select a page (and thus are translated). Lower bits 544, which select a byte within a page, are called the offset. Offset bits are not modified during the translation. Since microprocessor 100 can handle page sizes ranging between 4K-byte to 16M-byte, the number of offset bits varies from 12 to 24 bits.

Translations are maintained by the operating system using tables in memory. A subset of these translations are loaded into the JTLB. JTLB contains 64 entries, one for each translation. Each entry 501 maps a pair of virtual pages, referred to as the "even" and "odd" pages. The contents of these entries are maintained by the operating system. If an instruction needs a translation which is not already in the JTLB, an exception is taken so that the operating system can compute and load the needed translation. If the needed translation is present, the program can execute without delays.

The 64 entries in the JTLB map up 2 Gbyte of virtual memory. Each entry 500 comprises a comparator 505 for comparing the page address and region bits of the virtual address with the virtual page number stored in a register 510. The virtual page number corresponds to a pair of translations stored in each entry. The virtual page number is loaded from coprocessor register 571 (CPO #10, "EntryHi") using privileged instructions.

The size code (indicating the size of the pages) which is stored in coprocessor register 570 (CPO #5, "PageMask"), is loaded into a register 515. Table V lists the cache page size codes. The size code determines the number of page address bits and index bits. This is important since only page address bits are translated.

TABLE V

Cache Page Size

| Size Code | | | Virtual Address Bits | | | |
|---|---|---|---|---|---|---|
| PageMask[24:13] | Size[5:0] | Page Size | Page | Low | Offset | Description |
| 000000000000 | 00000<u>0</u> | 4 Kbytes | 39:12 | 12 | 11:0 | Smallest page. |
| 000000000011 | 0000<u>01</u> | 16 Kbytes | 39:14 | 14 | 13:0 | |
| 000000001111 | 000<u>011</u> | 64 Kbytes | 39:16 | 16 | 15:0 | |
| 000000111111 | 00<u>0111</u> | 246 Kbytes | 39:18 | 18 | 17:0 | |
| 000011111111 | 0<u>01111</u> | 1 Mbyte | 39:20 | 20 | 19:0 | |
| 001111111111 | 0<u>11111</u> | 4 Mbytes | 39:22 | 22 | 21:0 | |
| 111111111111 | <u>111111</u> | 16 Mbytes | 39:24 | 24 | 23:0 | Largest page. |

The page size mask is architecturally defined as a 12-bit field, allowing the page size to be a power of 2. To perform page sizing in powers of 4, both bits of each bit pair in the mask are duplicated, so only six bits are actually used. If a mask bit is set, the two corresponding bits of the comparator are disabled, becoming "don't cares". The mask bit forces both bits low in order to disconnect both polarities of the virtual address bits from the gate of the transistor in the comparator's dynamic NOR gate. This gate is clamped low to keep this transistor off.

As previously mentioned, the ASID of the current virtual address is stored coprocessor register 571 (CPO #10, "EntryHi"). When the operating system refills a JTLB entry with a virtual page number, it also writes the associated ASID into a register 510. A comparator 506 compares the current virtual address' ASID with that stored in register 510. A match selects the JTLB entry by enabling comparator 505.

The "global" bit of a translation (bit "0" in coprocessor register 572 and 573) indicates that the task may be used by all processes. During JTLB refill, the global bit is written into a register 512 via AND gate 516. An OR gate 507 receives inputs from comparator 521 and register 512. Thus, the global bit enables the JTLB entry regardless of its ASID value.

If a virtual page address matches the virtual page number, comparator 505 generates a hit signal. The hit signal feeds into AND gates 524 and 525 along with a page select signal. The page select and hit signals select either register 520 or register 521. Register 520 contains the even physical frame number (PFN0) and associated cache attribute code loaded from coprocessor register 573 (CPO #2, "EntryLo0"). Similarly, register 521 holds the odd physical frame number (PFN1) and its cache attribute code from coprocessor register 572 (CPO #3, "EntryLo1").

The "cache attribute field" contains 5 bits. Table VI lists and defines the cache attribute field. Bits 2:0 is a 3-bit code which how data is cached. This code has three sources. For mapped regions, this code is taken from bits 5:3 of the selected "EntryLo" section of the matching JTLB entry. For the "kseg0" or "ckseg0" segments, this code is taken from virtual address bits 61:59. For other unmapped regions, this code is taken from bits 2:0 of the Configuration register.

TABLE VI

Cache Attribute Code

| Value (3-bits) | Name | Description |
|---|---|---|
| Location: | | |
| "C" (bits 5:3) | | Cache map code for mapped regions. (TLB: bits 5:3 of EntryLo0 and EntryLo1 registers). |
| Config[2:0] | | Cache map code for unmapped "kseg0" or "ckseg0" region. |
| VASdr[61:59] | | Cache map code within "xkphys" address space region. (Unmapped addresses x '8000 0000 0000 0000' - x'BFFF FFFF FFFF FFFF".) |
| Code: | | |
| 0 | | reserved. (Implemented same as code 2.) |
| 1 | | reserved. (Implemented same as code 3.) |
| 2 | Uncached. | Uncached. |
| 3 | Non-coherent. | Cached, non-coherent. |
| 4 | Exclusive. | Cached, coherent exclusive. |
| 5 | Shared. | Cached, coherent, exclusive on write. |
| 6 | | reserved. (Implemented same as code 7.) (Was "Cached, coherent, update on write" in R4000.) |
| 7 | Accelerated. | Uncached Accelerated. ("reserved" in R4000.) |

The remaining two bits (4:3) are provided to the system interface. For mapped regions, these bits are taken from bits 63:62 of "EntryLo". For unmapped regions, these bits are zero.

Uncached Attribute: An "uncached" operation bypasses the primary and secondary caches and always uses the system bus. Typically, uncached accesses are used to access input/output registers ("memory-mapped I/O") or for special memory, such as frame buffers or boot PROMS. Accessing these memories may have side effects. For example, reading from an I/O address may shift data from an input buffer. Thus, uncached memory are not executed speculatively.

Uncached Accelerate Attribute: An "uncached accelerated" access is similar to other "uncached" accesses, except that the external interface may accumulate the data into blocks before sending them on the system bus. The blocks are the same size as a secondary cache block. Block transfers are more efficient than single-word transfers.

Non-Coherent Attribute: A "non-coherent" access may use the caches, but the system bus will not check other caches to guarantee that data is consistent. Non-coherent blocks are always considered "exclusive" because they cannot be shared.

Coherent Attribute: A "coherent" access uses the cache and enables coherency checking on the system bus. It may be either "exclusive" or "shared". If "exclusive", any refill will request an exclusive copy. If "shared", only refills for store instructions will request an exclusive copy.

Codes 0, 1, and 6 are architecturally "reserved". The architecture does not guarantee how they are decoded, but no exception is defined if they are used. For decoding convenience, these codes are combined with codes 2, 3, and 7, respectively.

The page select signal for selecting which physical page frame to read depends on the low bit of the virtual address. This bit varies between bits 24 and 12, according to the size of the pages in the entry. This bit is statically selected within each entry using a 7-into-1 multiplexer 576 (7 variable page addressing bits). Using the page size mask as the control signal, multiplexer selects either bit 12, 14, 16, 18, 20, 22, or 24 as the page select signal to choose either the even or odd physical page frame. OR gates 590 and 591 are shown here for convenience only. Their functions are implemented by wire oring the bit lines between PFN0 and PFN1 so as to minimize propagation delay associated with reading the physical page frame.

Conventionally, a first multiplexer (7-into-1), using page size mask as its control line, selects the appropriate page addressing bit. This bit is then use to control a second mulitplexer (2-into-1) which selects either PFN0 or PFN1. Due to the large number of signal lines and necessary buffers, reading data from the second multiplexer takes significantly longer than reading the virtual page frame from JTLB 500.

When more then one entry is selected, the circuit's operation is undefined. If this occurs, their RAM cells could attempt to drive the same bit lines simultaneously high and low. This would result in large short-circuit currents which could damage the chip. Thus, the operating system, which normally only communicates with the JTLB only in kernel mode, should not load conflicting addresses.

JTLB prevents loading of conflicting addresses by implementing a hardware validity bit 575 in each entry 501. In the reset state, the output of AND gate 577 disables comparator 505. In the active state, comparator 505 is free to compare the virtual address with the virtual page number. During initialization, these bits are all reset. When an entry is refilled with a new virtual page number, its validity bit is set. The new virtual page number is then compared with the virtual page numbers stored in the other JTLB entries having the reset bit set. If a match is found, the entry which was just compared resets its validity bit, thus preventing multiple entries to be selected.

Although comparing the various entries to see if there is a match may seem simple, it is not the case, particularly when microprocessor 100 implements variable page sizing. For example, if the new virtual page number has a larger page size, its starting address may lie outside an existing, smaller page. This smaller page's entry normally would not generate a "hit" (match) because it compares bits which are part of the offset of the new page. To resolve this problem, the associative comparisons ignore all address bits which are part of the new page's offset field by inhibiting the strobes on these bits.

If a conflict is detected on any entry other than the one being written, the "TS" bit is set in the Status Register (bit 21). This is detected during the first cycle of a JTLB write, by logically AND-ing each match signal with the inverted output of the JTLB's index decoder 580 within each entry, and then OR-ing the results.

2. Operation

The JTLB translates virtual addresses from either the address calculation unit or from the Program Counter PC. The translation requires two cycles to compare virtual addresses and then select one real address.

In the first step cycle (the second half of the address calculation cycle, stage El), the calculated virtual page address is compared to each entry, using a dynamic comparator circuit 505 within each entry. The comparator's dynamic node is precharged while phase 1 is high, and is discharged while phase 1 is low if the entry does not match. This comparator uses three transistors for each bit in each entry. Two transistors implement an exclusive-OR logic function, comparing the bit's value to the corresponding address bit. If the cell stores a "0", the "true" address bit is selected; otherwise, the "false" address bit is selected. If the bits differ, the output is high, the third transistor is turned on, and the node is discharged. If any one entry matches, its dynamic node remains high; all other nodes are discharged. These values are latched at the end of the step.

Figure 5:
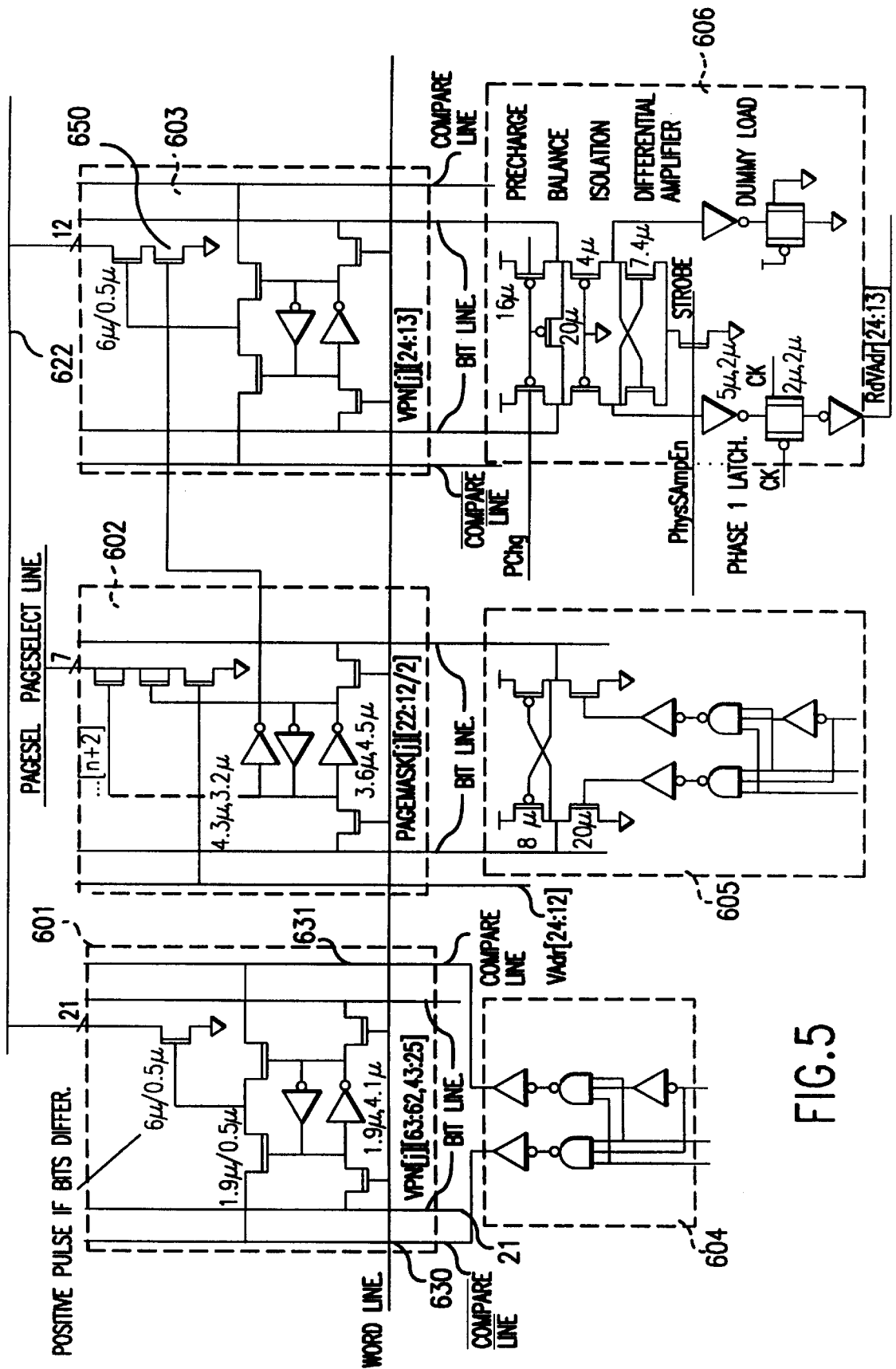
FIG. 5 discloses a comparator used in the translation lookaside buffer.

Referring to FIG. 5, the comparator is split into two parts. For simplicity, only a slice of the comparator is shown and the logic within each block represents one embodiment of the circuit. The upper part contains 21 simple CAM cells (601). The lower part contains 6 mask bits (602) and 12 maskable CAM cells (603). Each mask bit uses two transistors to control two corresponding maskable CAM cells. Output of the mask bit 602 gates transistor 650 which drives the hit line 622. If the mask is set, the transistor 650 is off, and hit line 622 is unaffected by the two CAM cells. These two bits are not compared. Otherwise, the transistor is on, and these bits are compared.

The mask bits are RAM cells. They contain the entry's page size code, which is described in Table V. In addition, they contain a 7-input dynamic multiplexer. Its output selects the virtual address bit which selects between physical page 0 (PN0) and 1 (PN1).

Each cell 601 uses a complementary pair of bit lines for reading and writing. Each pair is connected both to a write amplifier 605 and a read amplifier 606. The CAM cells also includes complementary pair of compare lines 630 and 631 which are driven by amplifier 604. Their outputs are zero during precharge in phase 1.

In the second cycle (phase 1 of during the data cache cycle, stage E2), the latched comparisons are gated with "0" to generate word lines. If there is a match, one of the two real addresses in the matching entry is selected. This selection is based on the lowest bit in the virtual page address. Because there are different size pages, a 7-to-1 multiplexer is included within each entry to select the appropriate bit of the virtual address (even bits 24 through 12). To minimize delay, the multiplexer is duplicated within each entry. Each entry's size is static, so the selection can occur while the addresses are compared. The translation sequence is used to translate instructions or data addresses as the processor executes normally.

JTBL refills, read, and probe sequences are initiated by "CPO" instructions. These are serialized so that they operate after all previous instructions have graduated.

To refill an entry ("Write Indexed JTLB Entry" (TLBWI) or "Write Random JTLB Entry" (TLBWR) instructions), four cycles are required. The first cycle compares the new virtual address with all enabled entries (valid bit set). If any entry matches, its valid bit is reset, effectively deleting it from the JTLB. This guarantees that the JTLB will never have duplicate translations for any address. If this occurs, the TS bit (bit 21) in the Status Register is set.

This comparison differs from normal translations because it must find any entry which overlaps the new page. In particular, if the new page is large, it may invalidate many smaller pages. To do this, the compare line drivers are gated with the PageMask Register. No pulse is generated on either compare line for low order bits which are masked. Thus, these low bits are not compared. Similarly, if the new translation is "global", it may match multiple entries.

During the second cycle, the EntryHi Register is written into the ASID and virtual address fields, and the EntryLo0 Register is written into physical page 0. During the third cycle, the EntryLo1 Register is written into physical page 1. During the fourth cycle, the ASID field is compared with all entries to set their valid latches.

A JTLB entry may be read using "Read Indexed JTLB Entry" (TLBR) instruction. Reading requires two cycles. The first cycle reads the ASID, the virtual address into the EntryHi Register, and physical page 0 into the EntryLo0 Register. The second cycle reads physical page 1 into the EntryLo1 Register. Since the TLBR instruction may change the ASID field in the EntryHi Register, all entries compare their ASID fields again to set their valid latches.

To determine if there are other matching entries, operating system issues a "Probe JTLB for Matching Entry" (TLBP) instruction. The ASID and virtual address in the EntryHi Register are compared to all active entries in the JTLB. If one matches, its index is loaded into bits 5:0 of the Index Register, and bit 31 is reset. Otherwise, bit 5:0 are zero and bit 31 is set.

While the above is a complete description of the preferred embodiment of the invention, various modifications, alternatives and equivalents may be used. Therefore, the above description should not be taken as limiting the scope of the invention which is defined by the appended claims.

What is claimed is:

1. In a computer system having a set of translations for mapping pages of virtual memory to pages of physical memory, the computer system having an apparatus for storing a subset of the set of translations, said apparatus comprising:
   a plurality of entries, each entry comprising:
      a storage space to store a first translation comprising a virtual translation page and a physical translation page, said virtual translation page corresponding to said physical translation page,
      a comparator to receive a virtual address to be mapped, said virtual address comprising a virtual page portion and a virtual offset portion, said virtual page portion comprising of higher bits of said virtual address and said virtual offset portion comprising of lower bits of said virtual address, said comparator comparing said virtual page portion with said virtual translation page and outputting said physical translation page corresponding to said virtual translation portion when said virtual page portion equals said virtual translation page, and
      a switch for setting and resetting said entry with which it is associated, said comparator being enabled when said switch is in the set state and disabled when said switch is in the reset state, said switch being set when said entry is loaded with said first translation and reset during a loading operation of a second translation when a portion of said first translation matches a portion of said second translation, said second translation being loaded subsequent to said first translation in a different entry thereby preventing simultaneous selection of more than one entry.

2. The apparatus as recited in claim 1 wherein said entry further comprises a task id for identifying the task with which said translation is associated, said task id is compared with the task id of the current task that said computer system is executing, said entry being enabled when a match is detected.

3. The apparatus as recited in claim 1 wherein said entry further comprises a global switch, said global switch, when set, enables said entry regardless of the task which said computer system is executing.

4. The apparatus as recited in claim 1 further comprising a circuit to append said outputted physical translation page with said virtual offset portion to form said physical address.

5. The apparatus as recited in claim 1 wherein said virtual translation page corresponds to a first physical translation page and a second physical translation page.

6. The apparatus as recited in claim 5 wherein a low bit of said virtual page portion selects between said first physical translation page and said second physical translation page.

7. The apparatus as recited in claim 6 wherein the pages of virtual memory and physical memory varies in size.

8. The apparatus as recited in claim 7 wherein the number of bits in said virtual address=n, the number of bits in said offset portion=x, and the number of bits in said page portion =n−x, and where x varies according to page size.

9. The apparatus as recited in claim 8 wherein said entry further comprises a storage area for storing a page mask, said page mask determining the value of x.

10. The apparatus as recited in claim 9 wherein said entry further comprises a multiplexer having said virtual address as its input and page mask as its control signal, said multiplexer outputting said low bit of said virtual page portion according to said page mask.

11. The apparatus as recited in claim 10 wherein said output of said multiplexer is connected to a selection circuit to select between said first physical translation page and said second physical translation page depending on said output value.

12. The apparatus as recited in claim 1 wherein said switch is reset during initialization of said computer system.

13. In a computer system having a virtual memory, a translation lookaside buffer comprising:
   an input for receiving a desired virtual address, said desired virtual address including a virtual page portion and an offset portion that vary in size;
   a plurality of entries coupled to said input, each of said entries including:
      a storage space for holding a stored virtual address, said storage space including a plurality of non-maskable and maskable CAM cells;
      a plurality of mask bits coupled to said maskable CAM cells representing a page size code of said stored virtual address;
      a comparator coupled to said non-maskable and maskable cells for comparing said desired virtual address with said stored virtual address, said comparator including a plurality of amplifiers for inputting said desired virtual address into said comparator; and
      a switch that enables and disables said comparator, said switch disabling said comparator in response to and concurrent with a write operation of said desired virtual address when a portion of said desired virtual address matches a portion of said stored virtual address, said write operation loading said desired virtual address into said translation lookaside buffer.

14. The computer system of claim 13 further comprising a pagemask register for holding a page size code of said desired virtual address, said pagemask register being used to gate said plurality of amplifiers.

15. The computer system of claim 14 wherein said switch enables said comparator in response to said storage space being loaded with said stored virtual address.

16. The computer system of claim 15 wherein said switch disables said comparator during initialization of said computer system.

17. A method for preventing selection of multiple entries in a translation lookaside buffer comprising the steps of:

comparing an incoming entry with a plurality of existing entries within said translation lookaside buffer;

disabling each of said existing entries that match a compared portion of said incoming entry; and writing said incoming entry into said translation lookaside buffer after said disabling step.

18. The method of claim 17 wherein said incoming entry comprises a first variable-sized page portion and a first variable-sized offset portion and further comprising the step of inhibiting said comparing step on said first variable-sized offset portion.

19. The method of claims 18 wherein each of said existing entries comprise a second variable-sized page portion and a second variable-sized offset portion and further comprising the step of inhibiting said comparing step on said second variable-sized offset portion.

20. The method of claim 19 wherein said disabling step comprises resetting a validity bit for each of said existing entries matching said compared portion of said incoming entry.

21. An apparatus for storing information containing a plurality of entries, each entry comprising:

a storage space for holding a first set of bits;

a comparator to receive a second set of bits and compare said second set of bits with said first set of bits; and a switch for setting and resetting said entry with which it is associated, said comparator being enabled when said switch is in the set state and disabled when said switch is in the reset state, said switch being set when said entry is loaded with said first set of bits and reset during a loading operation of said second set of bits when at least a portion of said first set of bits matches at least a portion of said second set of bits, said second set of bits being loaded subsequent to said first set of bits in a different entry.

22. A buffer comprising:

an input for servicing a received memory address; and a plurality of entries coupled to said input, each of said entries including:

a storage space for holding a stored memory address;

a comparator coupled to said storage space for comparing said received address with said stored address; and a switch that enables and disables said comparator, said switch disabling said comparator in response to and concurrent with a write operation of said received address when at least a portion of said received address matches at least a portion of said stored address, said write operation loading said received address into said buffer.

23. A method for preventing selection of multiple entries in an apparatus for storing information comprising:

comparing an incoming entry with a plurality of existing entries within said apparatus;

disabling each of said existing entries that match a compared portion of said incoming entry; and writing said incoming entry into said apparatus after disabling said each of said existing entries that match said compared portion of said incoming entry.

* * * * *